(12) United States Patent
Grassmann

(10) Patent No.: US 11,973,012 B2
(45) Date of Patent: Apr. 30, 2024

(54) POWER MODULE WITH SEMICONDUCTOR PACKAGES MOUNTED ON METAL FRAME

(71) Applicant: Infineon Technologies Austria AG, Villach (AT)

(72) Inventor: Andreas Grassmann, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 338 days.

(21) Appl. No.: 17/385,596

(22) Filed: Jul. 26, 2021

(65) Prior Publication Data

US 2023/0025736 A1    Jan. 26, 2023

(51) Int. Cl.
| | |
|---|---|
| *H01L 23/495* | (2006.01) |
| *H01L 21/48* | (2006.01) |
| *H01L 21/56* | (2006.01) |
| *H01L 23/31* | (2006.01) |

(52) U.S. Cl.
CPC .... *H01L 23/49575* (2013.01); *H01L 21/4825* (2013.01); *H01L 21/565* (2013.01); *H01L 23/3107* (2013.01); *H01L 23/49503* (2013.01); *H01L 23/4952* (2013.01); *H01L 23/49555* (2013.01); *H01L 23/49562* (2013.01); *H01L 23/49568* (2013.01)

(58) Field of Classification Search
CPC ........... H01L 23/49575; H01L 23/3107; H01L 23/49503; H01L 23/4952; H01L 23/49555; H01L 23/49562; H01L 23/49568; H01L 23/49531; H01L 23/49541; H01L 21/4825; H01L 21/565
See application file for complete search history.

(56) References Cited

U.S. PATENT DOCUMENTS

2006/0261453 A1* 11/2006 Lee .................. H01L 23/49551
                                                             257/E23.047
2014/0145318 A1    5/2014 Otremba et al.

FOREIGN PATENT DOCUMENTS

| CN | 101740541 A | 6/2010 |
|---|---|---|
| EP | 2858110 A1 | 4/2015 |
| EP | 3654373 A1 | 5/2020 |

* cited by examiner

*Primary Examiner* — Marc Anthony Armand
(74) *Attorney, Agent, or Firm* — Murphy, Bilak & Homiller, PLLC

(57) ABSTRACT

A power module includes a metal frame having a first and second device attach pads, first and second semiconductor packages each having an encapsulant body, a die pad exposed at a lower surface of the encapsulant body, a plurality of leads protruding out from the encapsulant body, and a potting compound that encapsulates both of the first and second semiconductor packages and partially covers the metal frame. The first semiconductor package is mounted on the metal frame such that the die pad of the first semiconductor package faces and electrically contacts the first device attach pad. The second semiconductor package is mounted on the metal frame such that the die pad of the second semiconductor package faces and electrically contacts the second device attach pad. The plurality of leads from each of the first and second semiconductor packages are electrically accessible from outside of the potting compound.

20 Claims, 13 Drawing Sheets

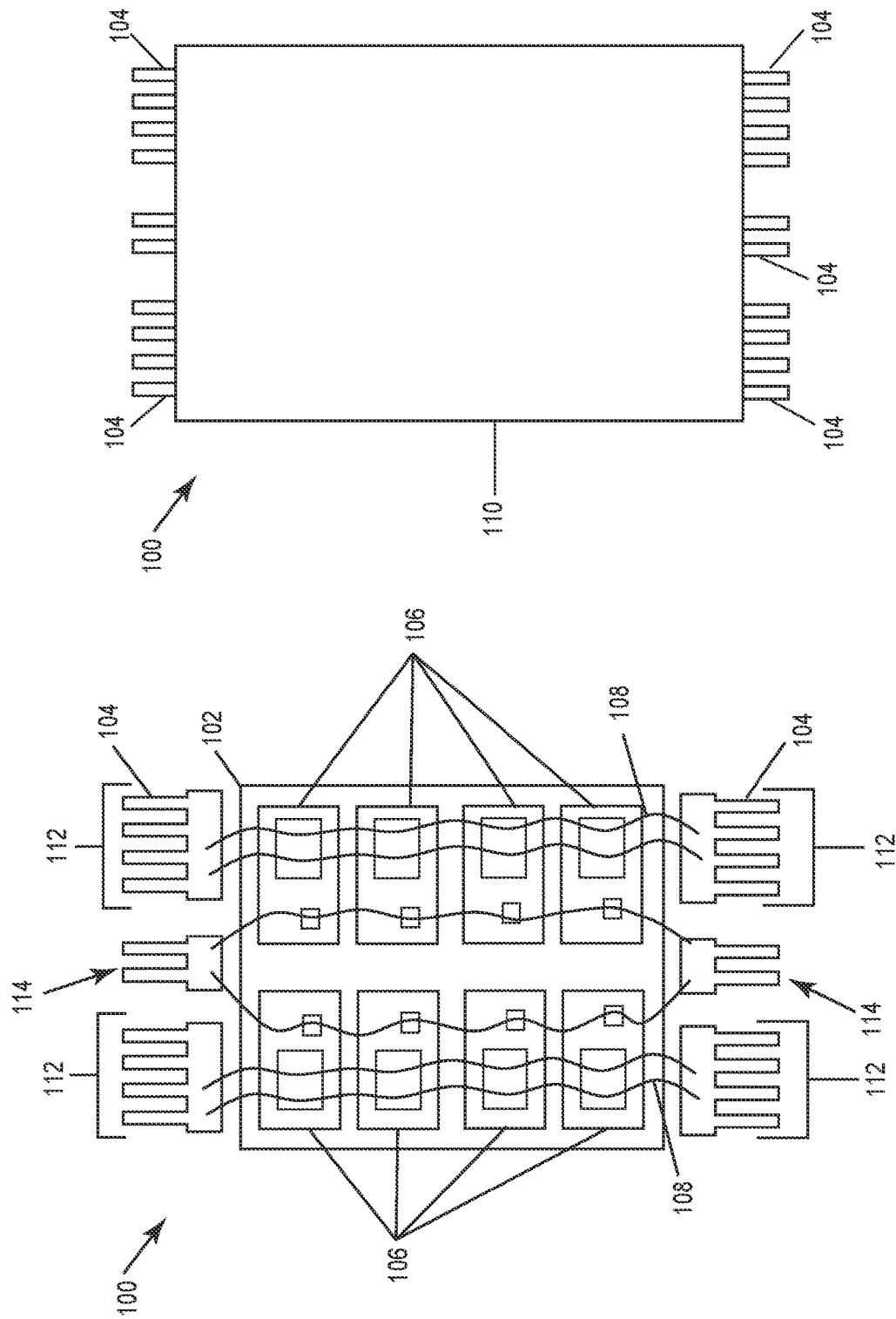

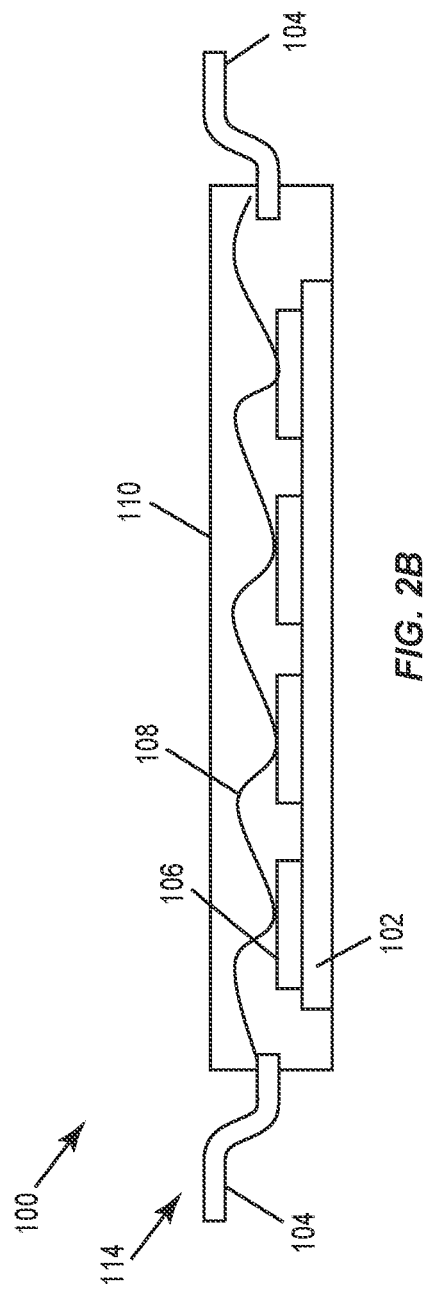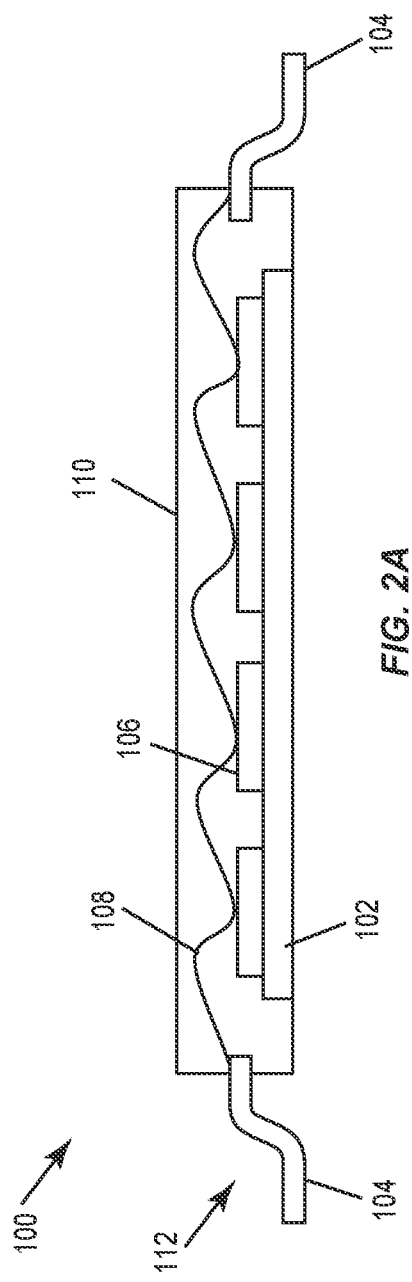
FIG. 2A
FIG. 2B
FIG. 2

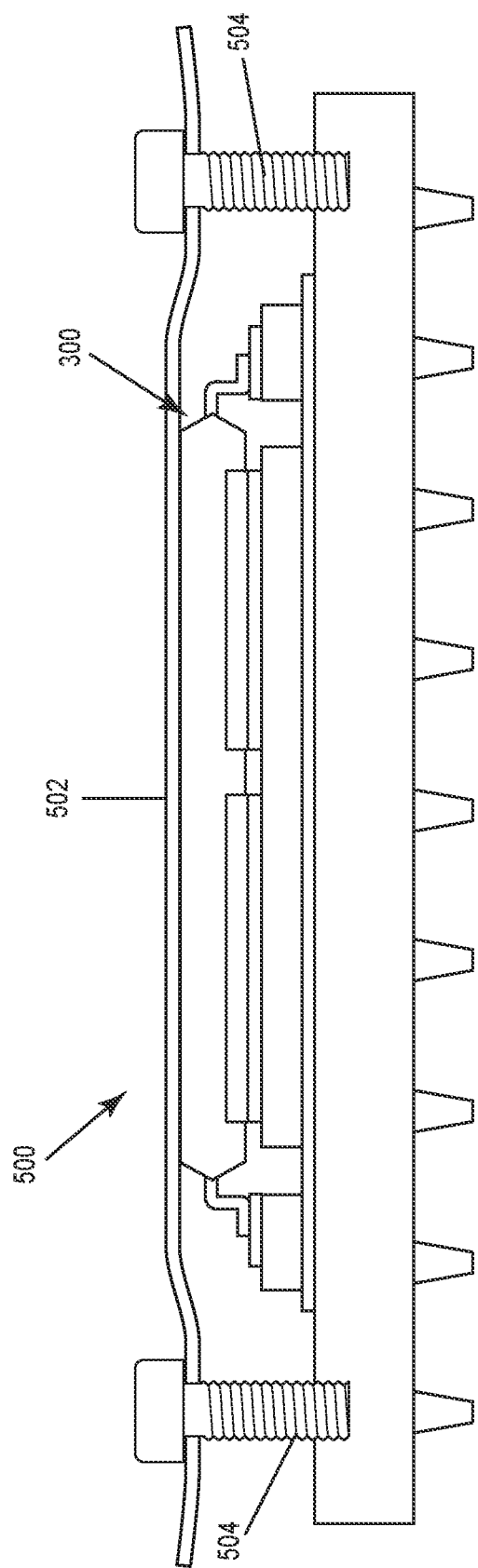

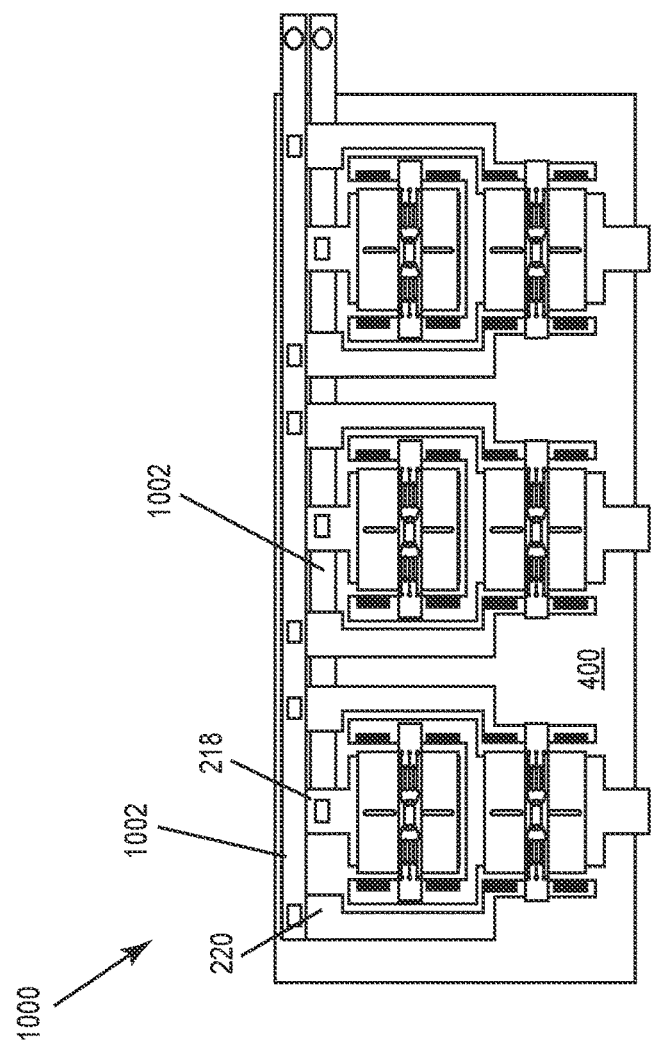
FIG. 9B
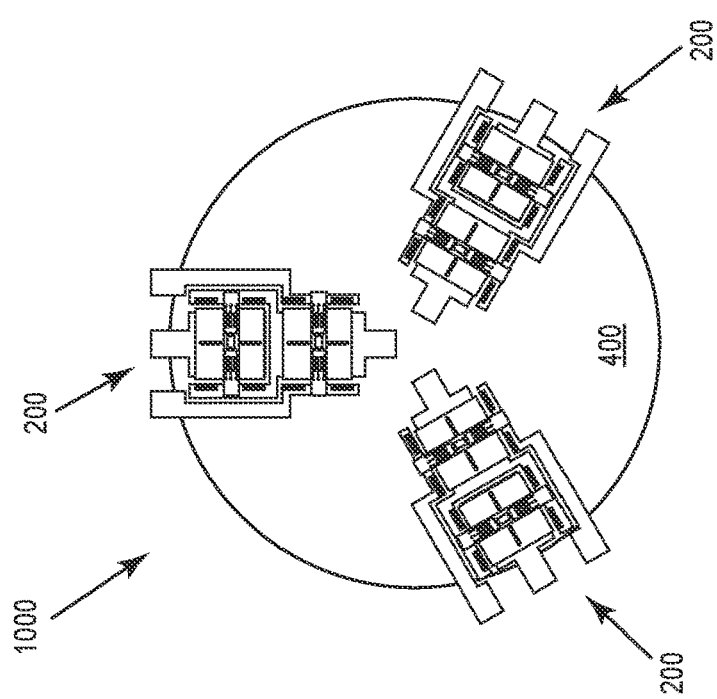
FIG. 9A
FIG. 9

POWER MODULE WITH SEMICONDUCTOR PACKAGES MOUNTED ON METAL FRAME

BACKGROUND

Many applications such as automotive and industrial applications utilize power electronic circuitry such as IGBTs (insulated gate bipolar transistors), power MOSFETs (metal oxide semiconductor field effect transistors), power diodes, etc. For example, common power circuits include single and multi-phase half-wave rectifiers, single and multi-phase full-wave rectifiers, voltage regulators, etc. Integrated power modules (IPMs) are used in power applications to accommodate power electronic circuitry and the logic circuitry the controls the switching of the power electronic circuitry. Integrated power modules (IPMs) often include a multi-layer power electronic substrate such as a DBC (direct bonded copper) substrate, IMS (insulated metal substrate) substrate, or an AMB (active metal brazed) substrate. The raw materials used to form these multi-layer power electronic substrates, such as copper, aluminum, ceramic, etc., and/or the processing steps used to form these multi-layer power electronic substrates, such as oxidation, etching, deposition, etc., add significant cost to these components. In certain applications that require power electronic circuitry, the design and production of a custom power module may be cost-prohibitive. Special tooling is needed to create specific form-factors of a power module, which may not be cost effective in lower volume applications. Moreover, integrated power modules may have particularly expensive yield losses due to the fact that a large number of dies may be provided in a single power module and failure by only one of the dies may result in the entire module being discarded. Thus, there is a need for a high-performance power electronics module at lower cost.

SUMMARY

A power module is disclosed. According to an embodiment, the power module comprises a metal frame comprising a first and second device attach pads, first and second semiconductor packages each comprising an encapsulant body, a die pad exposed at a lower surface of the encapsulant body, and a plurality of leads protruding out from the encapsulant body, and a potting compound that encapsulates both of the first and second semiconductor packages and partially covers the metal frame, wherein the first semiconductor package is mounted on the metal frame such that the die pad of the first semiconductor package faces and electrically contacts the first device attach pad, wherein the second semiconductor package is mounted on the metal frame such that the die pad of the second semiconductor package faces and electrically contacts the second device attach pad, and wherein the plurality of leads from each of the first and second semiconductor packages are electrically accessible from outside of the potting compound.

Separately or in combination, the metal frame further comprises a first interconnect bar that is spaced apart from the first device attach pad, and a second interconnect bar that is spaced apart from the second device attach pad, wherein the leads of the first semiconductor package are electrically connected to the first interconnect bar, and wherein the leads of the second semiconductor package are electrically connected to the second interconnect bar.

Separately or in combination, the metal frame further comprises a first tab that is continuously connected to the first device attach pad and protrudes out from the potting compound at a first side of the power module, and a second tab that is continuously connected to the second device attach pad and protrudes out from the potting compound at a second side of the power module that is opposite from the first side of the power module.

Separately or in combination, the metal frame comprises two of the first interconnect bars disposed on either side of the first device attach pad, and two of the second interconnect bars disposed on either side of the second device attach pad.

Separately or in combination, the first interconnect bars are continuously connected to the second device attach pad, and the metal frame further comprises third tabs that protrude out from the potting compound at the first side of the power module, wherein the third tabs are connected to the second interconnect bars via outer connection spans of the metal frame that are disposed on either side of the first interconnect bars.

Separately or in combination, the power module further comprises a first circuit board mounted on an upper surface of the first semiconductor package, and a second circuit board mounted on an upper surface of the first semiconductor package, wherein the first semiconductor package comprises a first group of leads that bend downward and electrically contact the first interconnect bar and a second group of leads that bend upward and electrically contact the first circuit board, and wherein the second semiconductor package comprises a first group of leads that bend downward and electrically contact the second interconnect bar and a second group of leads that bend upward and electrically contact the second circuit board.

Separately or in combination, the power module further comprises press-fit connectors affixed to each of the first and second circuit boards and protruding out from the potting compound, and wherein the press-fit connectors are electrically connected to the first group leads from the first and second semiconductor packages via the first and second circuit boards, respectively.

Separately or in combination, the power module further comprises a first discrete electronics component mounted on an upper surface the first circuit board, and a second discrete electronics component mounted on an upper surface the second circuit board.

Separately or in combination, the power module further comprises a metal substrate, a clamp securing the metal frame and the first and second semiconductor packages to the metal substrate by mechanically pressing against upper surfaces of the first and second semiconductor packages, and an electrical isolation structure that electrically isolates the metal frame from the metal substrate.

Separately or in combination, the electrical isolation structure comprises a layer of electrically insulating material and thermal interface material disposed on either side of the layer of electrically insulating material.

Separately or in combination, the electrical isolation structure comprises a power electronics substrate.

According to another embodiment, the power module comprises a metal frame comprising first and second device attach pads, first and second semiconductor packages that are mounted on the first and second device attach pads, respectively, and a potting compound that encapsulates both of the first and second discrete transistor packages and partially covers the metal frame, wherein the power module comprises a half-bridge circuit, wherein the first semiconductor package is a high-side switch of the half-bridge circuit, wherein the second semiconductor package is a low-side switch of the half-bridge circuit, and wherein power module comprises conductive tabs that are exposed from the potting compound and provide electrical accessibility to each terminal of the half-bridge circuit.

Separately or in combination, the power module further comprises a first circuit board mounted on an upper surface of the first semiconductor package, a second circuit board mounted on an upper surface of the second semiconductor package, wherein the first semiconductor package comprises a second group of leads that bend upward and electrically contact the first circuit board, wherein the second semiconductor package comprises a second group of leads that bend upward and electrically contact the second circuit board.

Separately or in combination, the metal frame further comprises a first interconnect bar that is spaced apart from the first device attach pad, and a second interconnect bar that is spaced apart from the second device attach pad, wherein the leads of the first semiconductor package comprise a first group of leads that bend downward and electrically contact the first interconnect bar, wherein the leads of the second semiconductor package comprise a first group of leads that bend downward and electrically contact the second interconnect bar, and wherein the first interconnect bar is connected to the second device attach pad.

A method of producing a power module is disclosed. According to an embodiment, the method comprises providing a metal frame comprising a first and second device attach pads, providing first and second semiconductor packages each comprising an encapsulant body, a die pad exposed at a lower surface of the encapsulant body, and a plurality of leads protruding out from the encapsulant body and mounting the first semiconductor package on the metal frame such that the die pad of the first semiconductor package faces and electrically contacts the first device attach pad, mounting the second semiconductor package on the metal frame such that the die pad of the second semiconductor package faces and electrically contacts the second device attach pad, and encapsulating both of the first and second semiconductor packages with a potting compound that encapsulates and partially covers the metal frame.

Separately or in combination, the metal frame further comprises a first interconnect bar that is spaced apart from the first device attach pad, and a second interconnect bar that is spaced apart from the second device attach pad, wherein mounting the first semiconductor package comprises electrically connecting the leads of the first semiconductor package to the first interconnect bar, and wherein mounting the second semiconductor package comprises electrically connecting the leads of the second semiconductor package to the second interconnect bar.

Separately or in combination, the leads of the first and second semiconductor packages each comprise a second group of leads that bend upward, wherein the method further comprises mounting a first circuit board on top of the first semiconductor package, mounting a second circuit board on top of the second semiconductor package, electrically connecting the second group leads of the first semiconductor package to the first circuit board, and electrically connecting the second group of leads of the second semiconductor package to the second circuit board.

Separately or in combination, encapsulating both of the first and second semiconductor packages comprises forming a dam on the metal substrate that forms an enclosed region around the first and second semiconductor packages and filling the enclosed region with the potting compound.

Separately or in combination, the method further comprises configuring the power module to comprise a half-bridge circuit, wherein the first semiconductor package is a high-side switch of the half-bridge circuit, and wherein the second semiconductor package is a low-side switch of the half-bridge circuit Separately or in combination, the metal frame comprises first and second third tabs that are exposed from the potting compound after encapsulating both of the first and second semiconductor packages, the second and third tabs being electrically connected to first and second DC voltage terminals of half-bridge circuit, respectively, and wherein the method further comprises connecting the first and second tabs to external busbar structures after encapsulating both of the first and second semiconductor packages.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A and 1B, illustrates a semiconductor package, according to an embodiment. FIG. 1A schematically illustrates a plan view of the interior elements of the semiconductor package, and FIG. 1B illustrates a plan view of the exterior of the semiconductor package.

FIG. 2, which includes FIGS. 2A and 2B, illustrates a semiconductor package, according to an embodiment. FIG. 2A schematically illustrates a side view of the interior elements of the semiconductor package in a first cross-section, and FIG. 2B schematically illustrates a side-view of the interior elements of the semiconductor package in a second cross-section that is spaced apart from the first cross-section.

FIG. 4A illustrates a plan view of the assembly, FIG. 4B illustrates a schematic view of the assembly along the cross-section I-I' identified in FIG. 4A, and FIG. 4C illustrates a schematic view of the assembly along the cross-section II-II' identified in FIG. 4A FIG. 5, which includes FIGS. 5A and 5B, illustrates an assembly of multiple semiconductor packages mounted on a metal frame with a clamp securing the semiconductor packages to a metal substrate, according to an embodiment. FIG. 5A illustrates a plan view of the assembly, and FIG. 5B schematically illustrates a side view of the assembly.

FIG. 6A illustrates the assembly after forming an dam structure, and FIG. 6B illustrates the assembly after filling the dam structure with a potting compound.

FIG. 9, which includes FIGS. 9A and 9B, illustrates a power module that comprises a metal frame and semiconductor packages mounted thereon, according embodiments. FIG. 9A illustrates a power module with a star shaped configuration, and FIG. 9B illustrates a power module that comprises external busbars.

DETAILED DESCRIPTION

Figure 3:
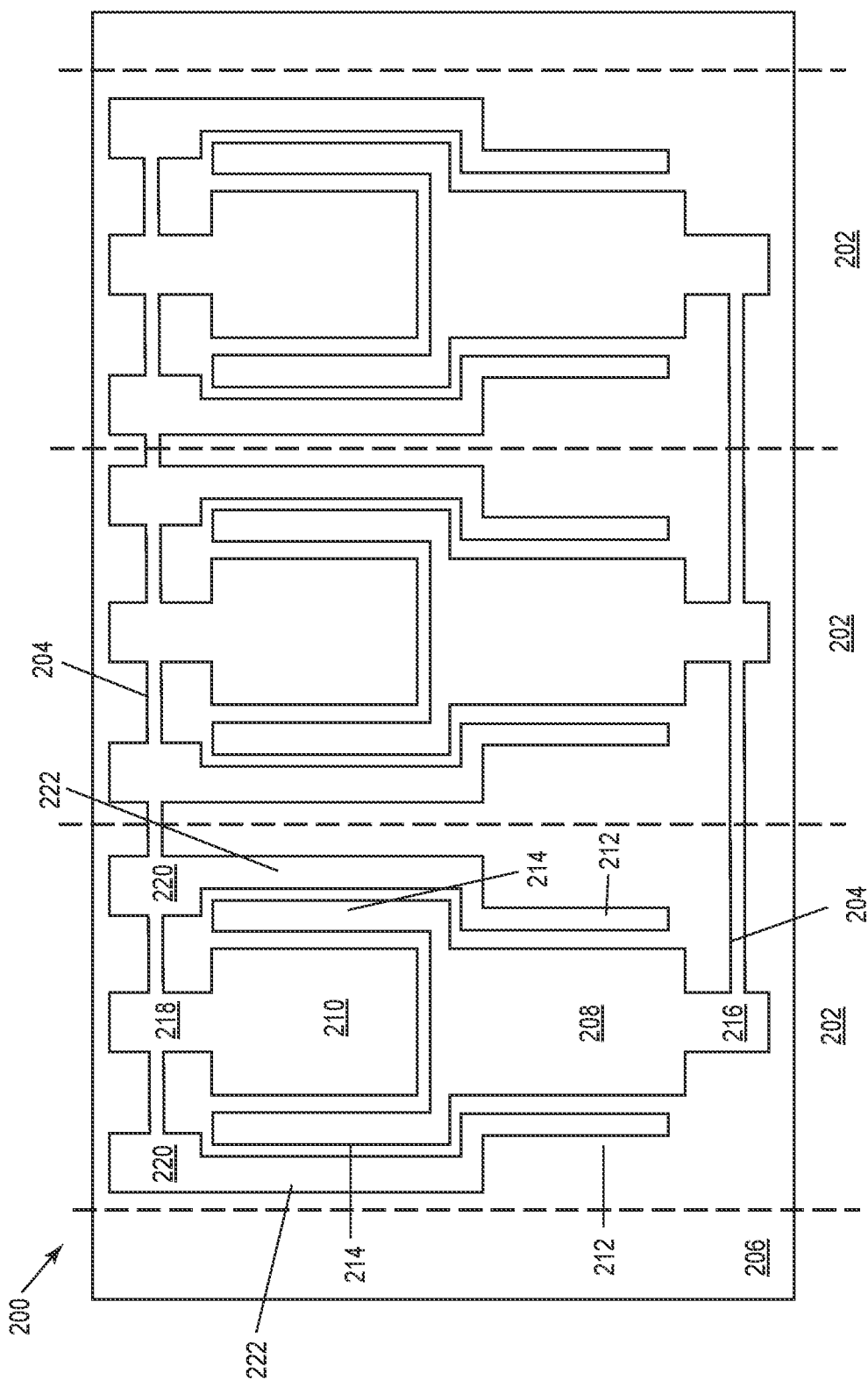
FIG. 3 illustrates a plan view of a metal frame for forming a power module, according to an embodiment.

Embodiments disclosed herein include a power module that includes a metal frame to accommodate multiple semiconductor packages mounted thereon. The semiconductor packages are encapsulated by a potting compound that covers the semiconductor packages. The metal frame comprises metal tabs that protrude out from the potting compound and provide electrical accessibility to the various terminals of the semiconductor packages. Advantageously, the metal frame can be provided from a planar sheet metal, e.g., a copper sheet, and the required geometry of the metal frame can be created by low-cost metal processing techniques, e.g., stamping, punching, etching, etc. A significant cost savings is therefore obtained in comparison to power modules that utilize expensive multi-layer power electronic substrates, e.g., DBC substrates, IMS substrates, AMB substrates, etc. and/or require specific form factors for plastic housings. Moreover, the semiconductor packages mounted on the metal frame may be previously tested and qualified. In this way, yield losses are minimized, as there is little chance that the various semiconductor dies in the power module are defective after assembling the power module. The power module may additionally include circuit boards that are mounted on top of the packages. These circuit boards may be connected to upward bending leads of the semiconductor packages. This allows for control signalling and/or sense signalling to be applied to the various semiconductor packaged via the circuit boards. Moreover, the circuit boards can accommodate a number of additional components, driver devices, passive devices, etc., thereby facilitating a high degree of integration and customization flexibility at low cost.

Referring to FIG. 1, a semiconductor package 100 is depicted, according to an embodiment. The semiconductor package 100 comprises a die pad 102 and a plurality of leads 104. The die pad 102 and the leads 104 can be part of a common lead frame structure that is formed from an electrically conductive material such as copper (Cu) Nickel, (nickel phosphorous) NiP, silver (Ag), palladium (Pd) gold (Au), etc., alloys or combinations thereof. According to one technique, the common lead frame structure is provided by a sheet of metal, and the die pad 102 and the leads 104 are formed by performing metal processing techniques such as stamping, punching, etching, bending, etc., on this planar sheet of metal.

The semiconductor package 100 further comprises a plurality of semiconductor dies 106 mounted on the die pad 102. Generally speaking, the semiconductor dies 106 can have a wide variety of device configurations. For example, the semiconductor dies 106 can be configured as discrete devices, e.g., Metal Oxide Semiconductor Field Effect Transistors), IGBTs (Insulated Gate Bipolar Transistors), HEMTs (High Electron Mobility Transistors), diodes, etc. Alternatively or in combination, the semiconductor dies 106 can be configured as integrated circuit devices, e.g., drivers, controllers, etc. The semiconductor dies 106 can include IV semiconductor materials, e.g., silicon, silicon germanium, silicon carbide, etc., and/or type III-V semiconductor materials, e.g., gallium nitride, gallium arsenide, etc. Some or all of the semiconductor dies 106 can be configured as a vertical device, which refers to a device that is configured to current flowing between a main surface and an opposite facing rear surface of the semiconductor die. Alternatively, some or all of the semiconductor dies 106 can be configured as a lateral device, which refers to a device that is configured to current parallel to a main surface of the semiconductor die.

The semiconductor package 100 comprises electrical interconnect elements that provide electrical connections between at least some terminals of the semiconductor dies 106 and the leads 104. In the depicted embodiment, these electrical interconnect elements are bond wires 108 that provide an electrical connection between upper surface bond pads of the semiconductor dies 106 and the leads 104. Alternatively, these electrical connections may be provided by other types of electrical interconnect elements, e.g., metal clips, ribbons, etc.

The semiconductor package 100 further comprises an encapsulant body 110 that seals and electrically isolates the semiconductor dies 106 and associated electrical connections. The encapsulant body 110 comprises an electrically insulating material such as epoxy, thermosetting plastic, ceramic, FR-4, etc. According to an embodiment, the encapsulant body 110 is molded plastic structure that is formed by a molding process such injection molding, transfer molding, compression molding, etc. According to another embodiment, the encapsulant body 110 is a laminate structure that comprises multiple layers of laminate material (e.g. FR-4) successively stacked on top of one another. In that case, the electrical connections to the semiconductor dies 106 may be provided by structured metallization layers that are formed above or between the layers of laminate material.

According to an embodiment, the semiconductor package 100 is configured as a power switching device package. A power switching device package comprises a first load terminal, a second load terminal, and a control terminal. In a commonly known manner, a power switching device package is configured to perform a switching operation between the first load terminal and the second load terminal via the control terminal. A power switching device package is rated to accommodate voltages of at least 100 V (volts) and more commonly on the order of 600 V, 1200V between the first and second load terminals, and/or is rated to accommodate currents of at least 1 A (amperes) and more commonly on the order of 10 A, 50 A, 100 A or more. A power switching device package may comprise multiple semiconductor dies 106 (e.g., as shown) connected in parallel with one another, wherein the semiconductor dies 106 collectively accommodate the load voltage and current during operation. Each of these semiconductor dies 106 may be configured as a discrete transistor die, e.g., MOSFET, HEMT, IGBT, etc., wherein each discrete transistor die has the above mentioned high voltage and/or current rating. A power switching device package may additionally comprise additional discrete diodes, such as power diode dies that are configured as reverse conducting diodes in the case on an IGBT. While the depicted embodiment shows a semiconductor package 100 with six semiconductor dies 106, more generally a power switching device package may comprise any number of discrete transistor devices, including single transistor configurations.

According to an embodiment, the semiconductor dies 106 of the semiconductor package 100 are configured as discrete vertical transistor dies. Each of these discrete vertical transistor dies comprises a first load terminal and a control terminal disposed on an upper surface of the respective semiconductor die. These discrete vertical transistor dies further comprise a second load terminal disposed on a lower surface of the respective semiconductor die that faces the die pad 102. In the case that the discrete vertical transistor dies are configured as MOSFET devices, the first and second load terminals may respectively correspond to the source and drain terminals or vice-versa and the control terminal may correspond to the gate terminal. In the case that the discrete vertical transistor dies are configured as IGBT devices, the first and second load terminals respectively correspond to the collector and emitter terminals or vice-versa and the control terminal corresponds to the gate terminal.

The semiconductor package 100 comprises a first group 112 of leads 104 that form one terminal of the device and a second group 114 of leads 104 that form a second terminal of the device. A third terminal of the semiconductor package 100 may be provided by the die pad 102, which is exposed from the encapsulant body 110 at a lower surface of the semiconductor package 100, and is electrically connected to a lower surface terminal of the semiconductor dies 106 by a conductive adhesive, e.g., solder, sinter, conductive glue, etc. As shown, the first group 112 of leads 104 are each electrically connected to the first load terminals of each semiconductor die by bond wire connections and the second group 114 of leads 104 are each electrically connected to the control terminals of each semiconductor die by bond wire connections. While the depicted semiconductor package 100 is configured such that the second group 114 of leads 104 are disposed between two separate sub-groups of the first group 112 of leads 104, other arrangements are possible. Moreover, similar concepts may be used to provide further leads or groups of leads 104 that form separate device terminals. For example, the semiconductor package 100 may comprise further leads or groups of leads 104 that are configured as gate-sense terminals and/or source/emitter-sense terminals and/or drain/collector-sense terminals, etc.

Referring to FIG. 2, various cross-sectional views of the semiconductor package 100 are shown. As shown in FIG. 2A, the first group 112 of leads 104 may protrude out from a sidewall of the encapsulant body 110 and bend downward such that outer contact surfaces of the first group 112 of leads 104 are substantially parallel to a lower surface of the encapsulant body 110. As shown in FIG. 2B, the second group 114 of leads 104 may protrude out from a sidewall of the encapsulant body 110 and bend upward such that outer contact surfaces of the second group 114 of leads 104 are substantially parallel to an upper surface of the encapsulant body 110.

Referring to FIG. 3, an assembly for forming a power module comprises a metal frame 200. The metal frame 200 can be produced by metal processing techniques akin to the processing techniques used to produce lead frames for semiconductor packaging. For example, the metal frame 200 can be provided by a substantially uniform thickness sheet of conductive metal such as copper (Cu), aluminium (Al), nickel (Ni), nickel phosphorous (NiP), silver (Ag), palladium (Pd) gold (Au), etc., alloys or combinations thereof. Generally speaking, the thickness of this sheet metal can be in the range of 100 μm (microns)–1,000 μm. The geometric features of the metal frame 200 as depicted and to be described below can be formed by performing techniques such as stamping, punching, etching, bending, etc., on the sheet of conductive metal.

In the depicted embodiment, the metal frame 200 comprises a plurality of identically unit segments 202. Each unit segment 202 has the same basic geometry. The metal frame 200 may comprise tie bars 204 that are physically connected between unit segments 202 and/or between the tabs of the unit segments 202. As shown, the metal frame 200 may be arranged on a carrier structure 206 such as a soldering tool, with multiple ones of the unit segments 202 on a single carrier. While the depicted embodiments illustrate a metal frame 200 with three unit segments 202 that are used to produce one power module, this concept may be used to produce multiple power modules in parallel, wherein each module may comprise one or a plurality of the unit segments 202.

The unit segment of the metal frame 200 comprises first and second device attach pads 208, 210. The first and second device attach pads 208, 210 each comprise a substantially planar upper surface that is dimensioned to accommodate the mounting of a packaged semiconductor device thereon.

The unit segment of the metal frame 200 additionally comprises a first interconnect bar 212 that is spaced apart from the first device attach pad 208, and a second interconnect bar 214 that is spaced apart from the second device attach pad 210. The first interconnect bar 212 may be arranged as a landing pad to contact external leads 104 of a semiconductor package 100 mounted on the first device attach pad 208, and the second interconnect bar 214 may be arranged as a landing pad to contact external leads 104 of a semiconductor package 100 mounted on the second device attach pad 210. As shown, two of the first interconnect bars 212 may be disposed on either side of the first device attach pad 208, and two of the second interconnect bars 214 may be disposed on either side of the second device attach pad 210. Moreover, as shown, the first interconnect bars 212 may be directly connected to the second device attach pad 210, thereby providing a direct electrical connection between the two.

The unit segment 202 of the metal frame 200 additionally comprises a first tab 216, a second tab 218, and a third tab 220. The first, second, and third tabs 216, 218, 220 are configured to provide externally accessible points of electrical contact to the various terminals of the power module after an encapsulation material is formed on the metal frame 200, e.g., according to a technique to be described in further detail below. The first tab 216 (or tabs) may be continuously connected to the first device attach pad 208. The second tab 218 (or tabs) may be continuously connected to the second device attach pad 210. The third tab 220 (or tabs as shown) may be continuously connected to the first interconnect bar 212 and extend away from the same side of the unit segment 202 of the metal frame 200 as the second tab 218. In the case of the third tab 220 (or tabs), the metal frame 200 may further comprise outer connection spans 222 that are disposed outside of the second interconnect bars 214 so as to provide a direct conductive connection between the third tabs 220 and the first interconnect bars 212.

The geometry of the third tab 202 as described above and depicted in FIG. 3 just represents one possible option for a metal frame 200 that is configured to accommodate multiple semiconductor packages 100 with a particular electrical connectivity. Depending on the package configuration, the geometry of the interconnect bars, the device attach pads, tabs, etc. may be adapted to provide landing pads for electrical connection to any of a variety of different package footprints.

Figures 4, 4A:
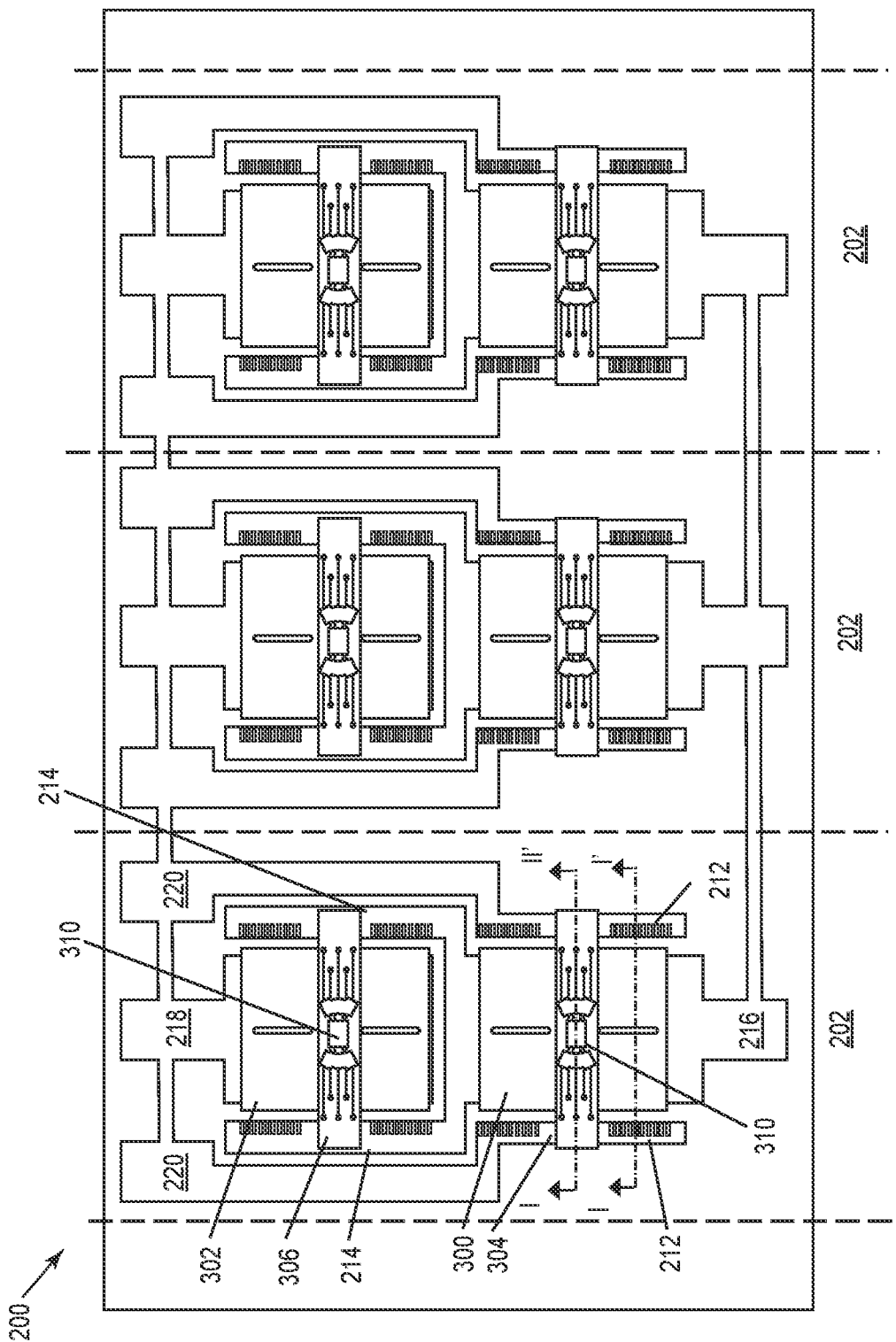
FIG. 4, which includes
FIGS. 4A, 4B and 4C, illustrates an assembly of multiple semiconductor packages mounted on a metal frame, according to an embodiment.

Referring to FIG. 4, semiconductor packages are mounted on the metal frame 200. In particular, a first semiconductor package 300 may be mounted on the first device attach pad 208 and a second semiconductor package 302 may be mounted on the second device attach pad 210. The first and second semiconductor packages 300, 302 may each be the semiconductor package 100 according to any of the embodiments described with reference to FIG. 1. Additionally or alternatively, the first and second semiconductor packages 300, 302 may be identical to one another. Before the mounting, the first and second semiconductor packages 300, 302 may be completely manufactured and tested. This may be done by the same or different manufacturer that produces the metal frame 200 and/or the complete power module. In any case, the first and second semiconductor packages 300, 302 may undergo typical semiconductor device qualification process such as functional verification and electrical/thermal stress testing, wherein the devices that do not pass are discarded and not used. As a result, the power module to be produced utilizes pre-qualified semiconductor packages as the basic building block to form an integrated power module with minimal expected yield losses.

The first semiconductor package 300 is mounted on the metal frame 200 such that the die pad 102 of the first semiconductor package 300 faces and electrically connects with the first device attach pad 208 and such that the first group 112 of leads 104 (i.e., the downward bending leads 104) from the first semiconductor package 300 contact and electrically connect with the first interconnect bar 212. Likewise, the second semiconductor package 302 is mounted on the metal frame 200 such that the die pad 102 of the second semiconductor package 302 faces and electrically connects with the second device attach pad 210 and such that the first group 112 of leads 104 (i.e., the downward bending leads 104) from the second semiconductor package 302 contact and electrically connect with the second interconnect bar 214. An electrical and mechanical connection between the various conductive surfaces of the semiconductor packages 100 and the metal frame 200 may be provided using a conductive adhesive, e.g., solder, sinter, conductive glue, etc.

A first circuit board 304 may be mounted on an upper surface of the first semiconductor package 300 and a second circuit board 306 may mounted on an upper surface of the second semiconductor package 302. According to an embodiment, the first and second circuit boards 304, 306 are each a PCBs (printed circuit boards) comprising a substrate of pre-peg material such as FR-4, CEM-1, G-10, etc. and conductive interconnect tracks and bond pads formed by structured metallization layers, e.g., layers of copper aluminium, etc., and alloys thereof. The first and second circuit boards 304, 306 may be, but are not necessarily, identical to one another. The first circuit board 304 is mounted such that the second group 114 of leads 104 (i.e., the upward bending leads 104) of the first semiconductor package 300 electrically contact bond pads on an a lower surface of the first circuit board 304. Likewise, the second circuit board 306 is mounted such that the second group 114 of leads 104 (i.e., the upward bending leads 104) of the second semiconductor package 302 electrically contact bond pads on a lower surface of the second circuit board 306. An electrical and mechanical connection between the leads 104 of the semiconductor packages and the bond pads of the circuit boards may be provided using a conductive adhesive, e.g., solder, sinter, conductive glue, etc. According to an embodiment, the first and second semiconductor packages 300, 302 are soldered to the metal frame 200 and the first and second circuit boards 304, 306 are soldered together by a common reflow step. Alternatively, separate soldering steps may be used to provide the assembly.

Optionally, one or both of the first and second circuit boards 304, 306 may comprise one or more discrete electronic components 310 mounted on an upper surface of the respective circuit board. Generally speaking, these discrete electronic components 310 may be any electronics deice with externally accessible contact surfaces, e.g., metal leads 104 or planar contact pads. Examples of these discrete electronic components 310 include packaged semiconductor devices, e.g., discrete transistors, diodes, etc., and integrated circuits such as controllers, driver circuits, etc. Other examples of these discrete electronic components 310 include passive components such as capacitors, inductors, resistors, etc.

According to an embodiment, the power module formed by the assembly comprises a half-bridge circuit. More particularly, each unit segment 202 of the metal frame 200 may be configured to comprise a half-bridge circuit. A half-bridge circuit refers to a specific type of circuit topology that comprises a high-side switch connected in series with a low-side switch. One load terminal of the high-side switch (e.g., the drain/collector of the high-side switch) is connected to a first DC voltage (e.g., positive potential/VDD), one load terminal of the low-side switch (e.g., the source/emitter of the low-side switch) is connected to a second DC voltage (e.g., negative potential or GND), with the remaining two load terminals of the high-side switch and the low-side switch (e.g., the source/emitter of the high-side switch and the drain/collector of the low-side switch) being connected together to form the output of the half-bridge circuit. In this embodiment, the first semiconductor package 300 may be a high-side switch of the half-bridge circuit and the second semiconductor package 302 may be a low-side switch of the half-bridge circuit. In that case, the first tab 216 may be configured as the as the output of the half-bridge circuit, the third tab 220 may be configured to provide a first DC voltage (e.g., positive potential/VDD) to the high-side switch, and the second tab 218 may be configured to provide a second DC voltage (e.g., negative potential or GND) to the low-side switch.

In the above-described arrangement, the discrete electronics component 310 mounted on the first and second printed circuit boards 304, 306 may be configured as a gate driver. These gate drivers are electrically connected to the control terminals of the high-side switch and the low-side switch via the first and second circuit boards 304, 306, and are configured to control the switching operation of the half-bridge circuit.

More generally, the arrangement and connection of the device attach pads, the interconnect bars, the tabs, and circuit boards may be adapted to meet any desired circuit topology and/or package configuration. Advantageously, because the geometry of the metal frame 200 is produced by standard metal processing techniques, the concept enables customization for a particular arrangement with minimal retooling costs. That is, expensive retooling and/or form factors is not necessary, as a power module can be easily customized through relatively inexpensive metal processing techniques.

Figures 4, 4B:
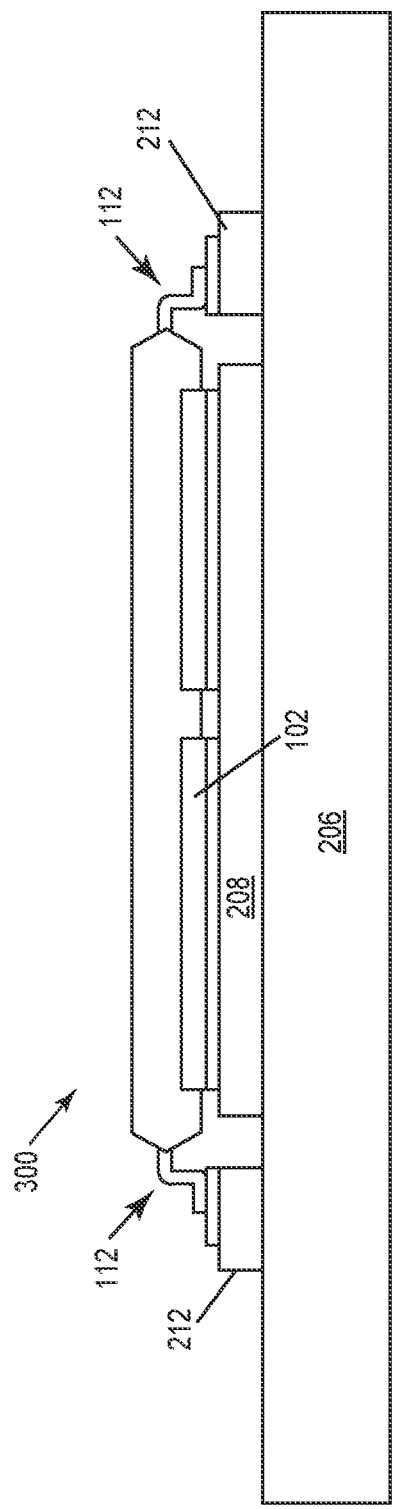
Figures 4, 4C:
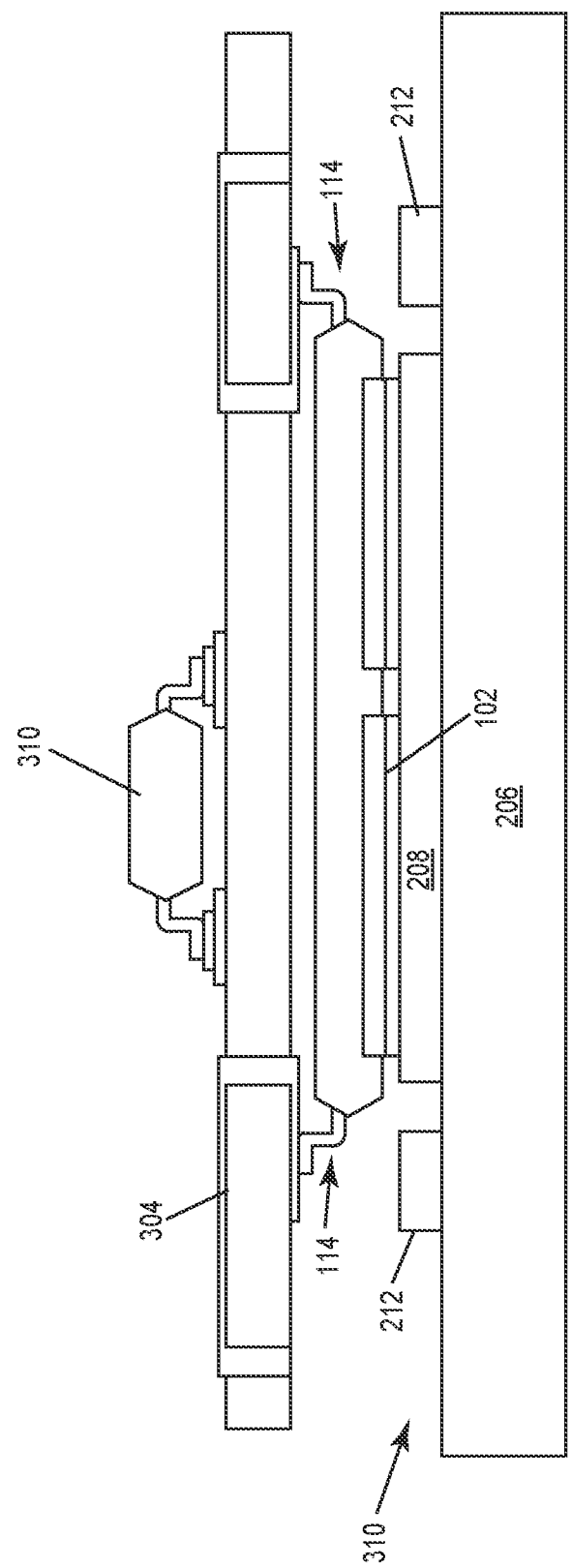

FIGS. 4B and 4B illustrate representative side views of the assembly along a cross-sectional line that goes through the first semiconductor package 300 and the first device attach pad 208. However, these views are representative of the arrangement of both the first semiconductor package 300 and the second semiconductor package 302, with the only difference being the presence of the outer connection spans 222 in a cross section that comprises the semiconductor package 302.

As shown in FIG. 4B, the metal frame 200 may be configured so that the first and second semiconductor packages 300, 302 can be mounted on the metal frame 200 in a surface mount device (SMD) style configuration. The structuring of the metal frame 200 allows for separate fixed voltages to be supplied to the load terminals of the semiconductor packages 100. As shown in FIG. 4B, the upward bending of the second group 114 of leads 104 allows for all signals other than the fixed voltage signals to be transmitted to/received from the semiconductor package 100 by the printed circuit boards. In the case of semiconductor packages configured to comprise sensing terminals, e.g., gate-sense, source-sense, etc., these terminals may be connected to the printed circuit boards by upward bending leads 104 in a similar manner.

Figures 5, 5A:
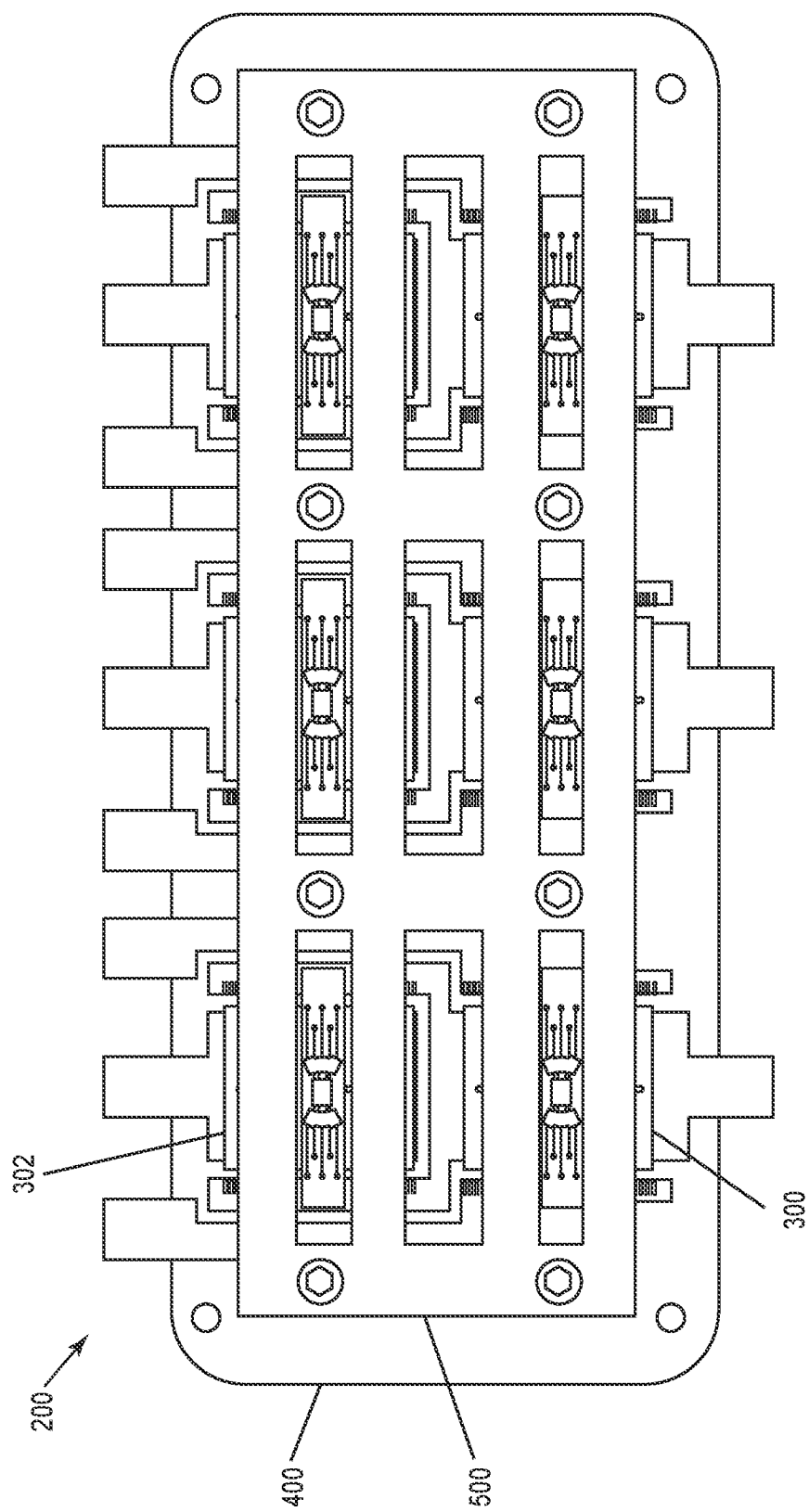

Referring to FIG. 5, the metal frame 200 with the semiconductor packages and the circuit boards mounted thereon may be arranged on a metal substrate 400. Thereafter, a clamp 500 is provided that secures the first and second semiconductor packages 300, 302 of each unit segment 202 with the metal frame 200 to the metal substrate 400. After securing the metal frame 200 with the semiconductor packages to the metal substrate 400 by the clamp 500, the tie bar structures 204 may be severed. This may be done using any of a variety of techniques, e.g., mechanical or laser cutting, punching, etc.

As shown in FIG. 5B, the clamp 500 may be configured to mechanically press against upper surfaces of the semiconductor packages. In the depicted embodiment comprises the clamp 200 an upper portion 502 with sufficient mechanical strength to press against the semiconductor packages and maintain their position. The upper portion 502 may be a relatively planar structure with openings that accommodate the circuit boards (e.g., as shown in FIG. 5A). The clamp 500 may additionally comprise fasteners 504 that are affixed to the metal substrate 400 in a commonly known manner. As shown, the fasteners 504 are configured as screws. More generally, any type of fastening mechanism, e.g., bolt, pin, etc. Separately or in combination, the clamp 500 may be any mechanism that is configured maintain the position of the metal frame 200 and the first and second semiconductor packages 300, 302.

According to an embodiment, an electrical isolation structure 600 is provided between the metal frame 200 and the metal substrate 400. The electrical isolation structure 600 comprises one or more layers of electrically insulating material so as to electrically isolate the metal frame 200 from the metal substrate 400. Generally speaking, the electrical isolation structure 600 may comprise any electrically insulating material, e.g., ceramic materials, glass materials, plastic materials, etc. According to an embodiment, the electrical isolation structure 600 comprises a thermal interface material or so-called thermal grease. These materials have a relatively high thermal conductivity relative to their electrical insulation properties. In one specific example, the electrical isolation structure 600 comprises a layer of electrically insulating material and thermal interface material disposed on either side of the layer of electrically insulating material. The electrically insulating material may be a thin layer (e.g., 10 µm to 100 µm) of relatively hard electrically insulating material such as ceramic. This arrangement introduces mechanical stability into the assembly, as thermal interface materials are soft and mechanically unstable.

The metal substrate 400 may be a heat sink that is configured to extract heat away from the semiconductor packages during operation. To this end, the metal substrate 400 may be formed from a thermally conductive metal such as aluminium, copper, etc., and any alloy or combination thereof. The metal substrate 400 may be mainly formed from aluminium if, for instance, low material cost is preferred. The metal substrate 400 may be mainly formed from copper if, for instance, thermal performance is preferred. Moreover, as shown, the lower surface of the metal substrate 400 may comprise pin fit protrusions that allow for the module to be mated with a corresponding heat sink structure.

Figures 6, 6A:
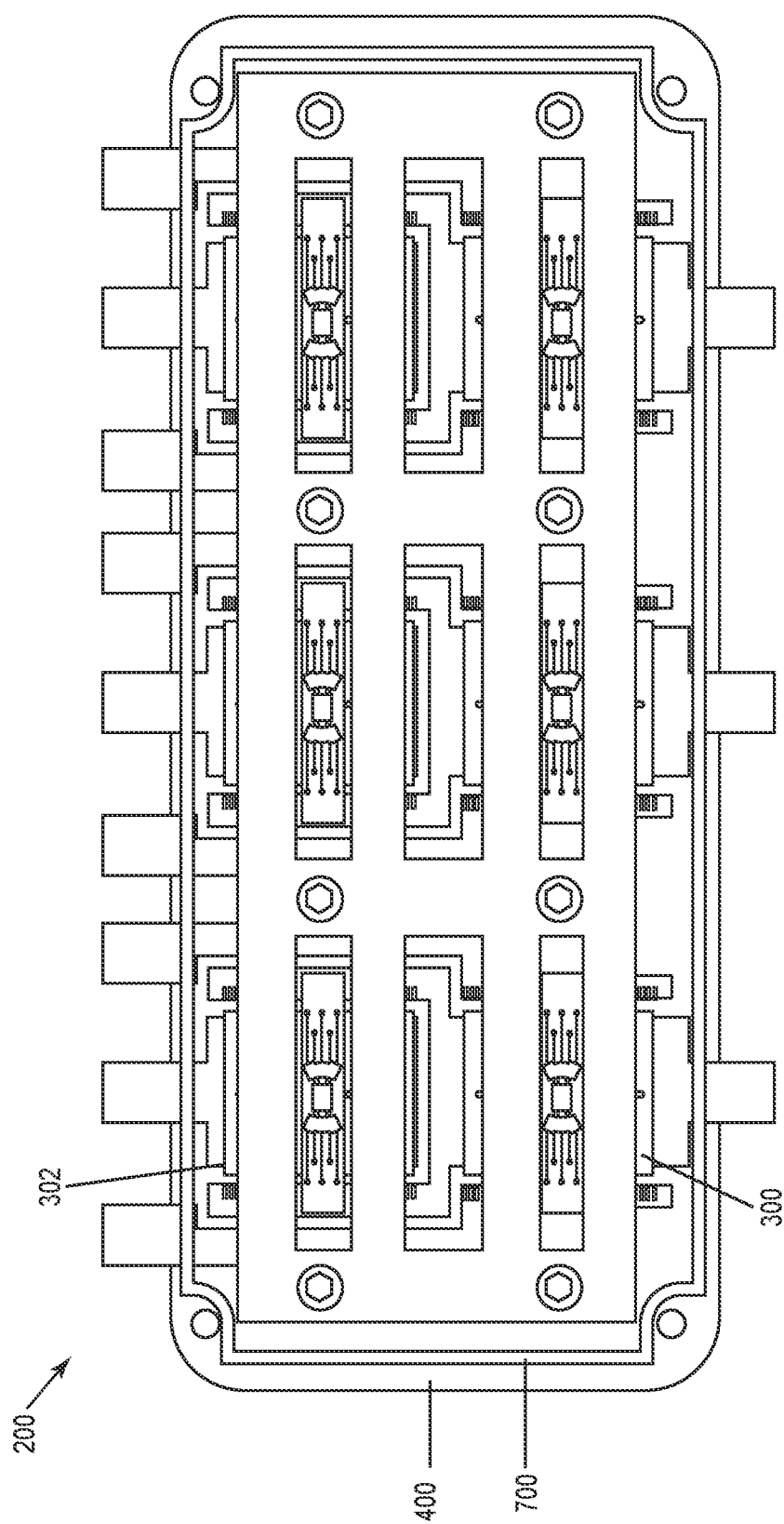
FIG. 6, which includes
FIGS. 6A and 6B, illustrates various steps for encapsulating an assembly of multiple semiconductor packages mounted on a metal frame.

Referring to FIG. 6, a process for forming a potting compound that encapsulates both of the first and second semiconductor packages 300, 302 and partially covers the metal frame 200 is depicted. According to an embodiment, the potting compound is formed by so-called dam-and-fill process. A dam-and-fill process is a two step process.

In an initial step as shown in FIG. 6A, a dam 700 that forms an enclosed region around the semiconductor packages is shown. In the depicted embodiment, the dam 700 is formed around the first and second semiconductor packages 300, 302 of the each third tab 202. More generally, the dam 700 can be formed in any desired geometry and may enclose any number of semiconductor packages. The dam 700 may be formed by a transfer molding technique, for example.

Figures 6, 6B:
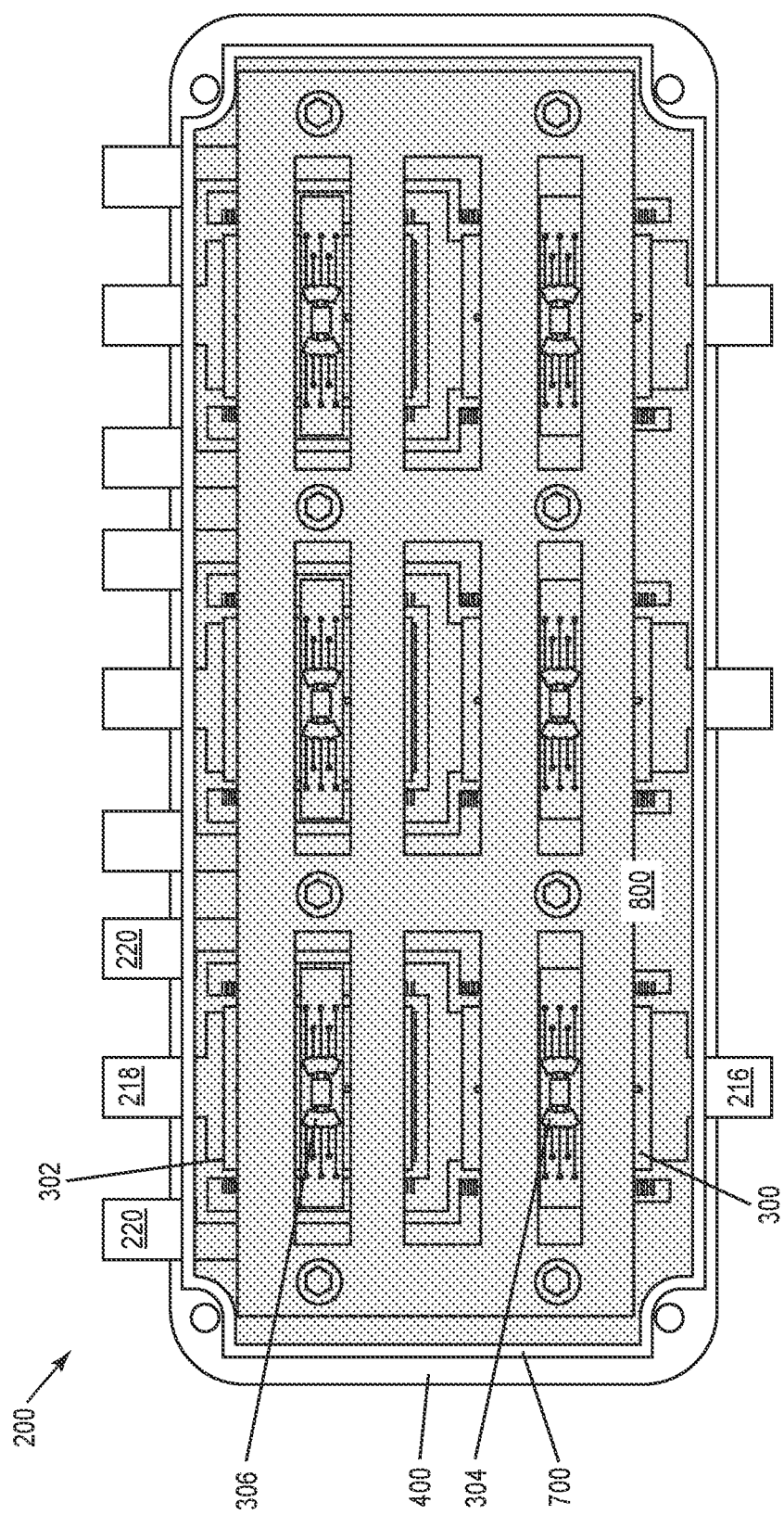

In an subsequent step shown in FIG. 6B, the interior volume of the dam 700 is filled with a potting compound 800. The potting compound 800 may be initially provided in a liquified state and subsequently hardened. Generally speaking, the potting compound 800 may comprise a polymer-based and/or silicone based electrically insulating material that is suitable for electrical isolation. The potting compound 800 may be filled at least up to the level of the upper portion 502 of the clamp 500 so as to completely cover the semiconductor packages. The potting compound 800 may also be filled to partially or completely cover the first and second circuit boards, 304, 306 if preferred. The vertical depth of the potting compound 800 may be determined by the height of the dam 700, for example.

After the potting compound 800 is formed, the terminals of the semiconductor package 100 are electrically accessible via the tabs. In particular, the first tab 216 protrudes out from the potting compound 800 at a first side of the power module and the second and third tabs 218, 220 protrude out from the potting compound 800 at a second side of the power module that is opposite from the first side. The second group 114 of leads 104 from the first and second semiconductor packages 300, 302 may be electrically accessed via the first and second printed circuit boards 304, 306. For example, openings may be formed the potting compound 800 and conductive connections to the first and second circuit board 304, 306 may be provided by via structures. Alternatively, the first and second printed circuit boards 304, 306 may be provided with external interconnect structures that protrude out from the potting compound 800, an example of which will be described in further detail below.

The dam and fill process illustrates just one example of a technique for encapsulating the semiconductor packages. More generally, any of a variety of semiconductor encapsulation methods and/or encapsulation material may be used to form an electrically insulating encapsulant structure.

Referring to FIG. 9, an optional configuration for providing electrical accessibility to the first and second circuit boards 304, 306, and hence to the second group 114 of leads 104 from both of the first and second semiconductor packages 300, 302 is shown. The assembly of FIG. 9 is shown before forming the potting compound 800 around the semiconductor packages. As shown in FIG. 9, press-fit connectors 900 may be provided in the first and second circuit boards 304, 306. The press-fit connectors 900 are electrically conductive structures that are configured to be inserted into an opening and securely retained thereafter by primarily elastic mechanical force. The press-fit connectors 900 can be formed from a relatively rigid conductive metal, such as copper. The press-fit connectors 900 can be anchored to the first and second circuit boards 304, 306 by openings in these circuit boards and/or by a solder material, for example. As shown, the circuit boards may be internally configured to form an electrical connection between the press-fit connectors 900 and the second group of leads 114. As a result, the press-fit connectors 900 are electrically connected to the second group of leads 114 from the first and second semiconductor packages 300, 302 via the first and second circuit boards 304, 306, respectively. The potting compound 800 may be formed around the base of the press-fit connectors 900 such that the press-fit connectors 900 protrude out from the potting compound 800 after the dam 700 is filled with the potting compound 800.

Referring to FIG. 9, a side view of an assembly comprising one of the semiconductor packages mounted on the metal frame 200 is shown, according to another embodiment. The assembly of FIG. 9 differs from the previous embodiments in that the electrical isolation structure 600 is a power electronics substrate. Examples of these power electronics substrates include DBC (direct bonded copper) substrates, AMB (active metal brazed) substrates, or an IMS (insulated metal substrate) substrates, for example. These power electronics substrate may comprise an electrically insulating substrate portion 602 of e.g., a ceramic, and structured metallization layers 604 bonded to one or both sides of the electrically insulating substrate portion 602. In contrast to the previously described embodiments, an electrical isolation structure 600 that is configured as a power electronics substrate may provide enhanced electrical isolation, as these substrates are typically designed withstand very high voltage operation. Optionally, the metal substrate 400 may be formed of pure or substantially pure copper for an additional performance benefit.

Referring to FIG. 10, two different examples of power modules 100 that may be formed using the metal frame 200 concept described herein are depicted. In the embodiment of FIG. 10A, the power module 100 is arranged on a circular shaped metal substrate 400 and the metal frames 200 are arranged so that the tabs of each circuit are oriented 120 degrees apparent to one another, i.e., in a star-shaped configuration. Advantageously, the flexibility offered by the metal frame 200 production technique described herein, this form factor is easily produced with minimal specific tooling. This form factor represents just one example of a variety of geometries that may be produced and customized to a particular application while using the metal frame concept described herein. In the embodiment of FIG. 10B, the power module additionally comprises external busbar structures 1002. The external busbar structures 1002 may be connected to the tabs of the first and second semiconductor packages 300, 302 so as to provide fixed voltages. For example, in the case that the power module is configured a half-bridge circuit, a first one of the external busbar structures 1002 may be electrically connected to a first DC voltage terminals of the half-bridge circuit (e.g., GND) via the second tab 218, and a second one of the external busbar structures 1002 may be electrically connected to a second DC voltage terminal of the half-bridge circuit (e.g., VDD) via the third tab 220. The metal processing techniques described herein advantageously make it easy to customize the power distribution of the semiconductor packages to be compatible with any of a variety of external busbar structures, such as the depicted configuration.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power module, comprising:
a metal frame comprising first and second device attach pads;
first and second semiconductor packages each comprising an encapsulant body, a die pad exposed at a lower surface of the encapsulant body, and a plurality of leads protruding out from the encapsulant body; and
a potting compound that encapsulates both of the first and second semiconductor packages and partially covers the metal frame;
wherein the first semiconductor package is mounted on the metal frame such that the die pad of the first semiconductor package faces and electrically contacts the first device attach pad,
wherein the second semiconductor package is mounted on the metal frame such that the die pad of the second semiconductor package faces and electrically contacts the second device attach pad, and
wherein the plurality of leads from each of the first and second semiconductor packages are electrically accessible from outside of the potting compound.

2. The power module of claim 1, wherein the metal frame further comprises a first interconnect bar that is spaced apart from the first device attach pad, and a second interconnect bar that is spaced apart from the second device attach pad, wherein the leads of the first semiconductor package are electrically connected to the first interconnect bar, and wherein the leads of the second semiconductor package are electrically connected to the second interconnect bar.

3. The power module of claim 2, wherein the metal frame further comprises a first tab that is continuously connected to the first device attach pad and protrudes out from the potting compound at a first side of the power module, and a second tab that is continuously connected to the second device attach pad and protrudes out from the potting compound at a second side of the power module that is opposite from the first side of the power module.

4. The power module of claim 3, wherein the metal frame comprises two of the first interconnect bars disposed on either side of the first device attach pad, and two of the second interconnect bars disposed on either side of the second device attach pad.

5. The power module of claim 4, wherein the first interconnect bars are continuously connected to the second device attach pad, and wherein the metal frame further comprises third tabs that protrude out from the potting compound at the first side of the power module, wherein the third tabs are connected to the second interconnect bars via outer connection spans of the metal frame that are disposed on either side of the first interconnect bars.

6. The power module of claim 2, further comprising:
a first circuit board mounted on an upper surface of the first semiconductor package; and
a second circuit board mounted on an upper surface of the first semiconductor package,
wherein the first semiconductor package comprises a first group of leads that bend downward and electrically contact the first interconnect bar and a second group of leads that bend upward and electrically contact the first circuit board, and
wherein the second semiconductor package comprises a first group of leads that bend downward and electrically contact the second interconnect bar and a second group of leads that bend upward and electrically contact the second circuit board.

7. The power module of 6, wherein the power module further comprises press-fit connectors affixed to each of the first and second circuit boards and protruding out from the potting compound, and wherein the press-fit connectors are electrically connected to the first group leads from the first and second semiconductor packages via the first and second circuit boards, respectively.

8. The power module of 6, further comprising a first discrete electronics component mounted on an upper surface the first circuit board, and a second discrete electronics component mounted on an upper surface the second circuit board.

9. The power module of claim 1, further comprising:
a metal substrate;
a clamp securing the metal frame and the first and second semiconductor packages to the metal substrate by mechanically pressing against upper surfaces of the first and second semiconductor packages; and
an electrical isolation structure that electrically isolates the metal frame from the metal substrate.

10. The power module of 9, wherein the electrical isolation structure comprises a layer of electrically insulating material and thermal interface material disposed on either side of the layer of electrically insulating material.

11. The power module of 9, wherein the electrical isolation structure comprises a power electronics substrate.

12. A power module, comprising:
a metal frame comprising first and second device attach pads;
first and second semiconductor packages that are mounted on the first and second device attach pads, respectively; and
a potting compound that encapsulates both of the first and second discrete transistor packages and partially covers the metal frame,
wherein the power module comprises a half-bridge circuit,
wherein the first semiconductor package is a high-side switch of the half-bridge circuit,
wherein the second semiconductor package is a low-side switch of the half-bridge circuit, and
wherein power module comprises conductive tabs that are exposed from the potting compound and provide electrical accessibility to each terminal of the half-bridge circuit.

13. The power module of 12, further comprising:
a first circuit board mounted on an upper surface of the first semiconductor package;
a second circuit board mounted on an upper surface of the second semiconductor package,
wherein the first semiconductor package comprises a second group of leads that bend upward and electrically contact the first circuit board, and
wherein the second semiconductor package comprises a second group of leads that bend upward and electrically contact the second circuit board.

14. The power module of 12, wherein the metal frame further comprises a first interconnect bar that is spaced apart from the first device attach pad, and a second interconnect bar that is spaced apart from the second device attach pad, wherein the leads of the first semiconductor package comprise a first group of leads that bend downward and electrically contact the first interconnect bar, wherein the leads of the second semiconductor package comprise a first group of leads that bend downward and electrically contact the second interconnect bar, and wherein the first interconnect bar is connected to the second device attach pad.

15. A method of producing a power module, the method comprising:
providing a metal frame comprising first and second device attach pads;
providing first and second semiconductor packages each comprising an encapsulant body, a die pad exposed at a lower surface of the encapsulant body, and a plurality of leads protruding out from the encapsulant body; and
mounting the first semiconductor package on the metal frame such that the die pad of the first semiconductor package faces and electrically contacts the first device attach pad,
mounting the second semiconductor package on the metal frame such that the die pad of the second semiconductor package faces and electrically contacts the second device attach pad, and
encapsulating both of the first and second semiconductor packages with a potting compound that encapsulates and partially covers the metal frame.

16. The method of claim 15, wherein the metal frame further comprises a first interconnect bar that is spaced apart from the first device attach pad, and a second interconnect bar that is spaced apart from the second device attach pad, wherein mounting the first semiconductor package comprises electrically connecting the leads of the first semiconductor package to the first interconnect bar, and wherein mounting the second semiconductor package comprises electrically connecting the leads of the second semiconductor package to the second interconnect bar.

17. The method of claim 16, wherein the leads of the first and second semiconductor packages each comprise a second group of leads that bend upward, wherein the method further comprises:
mounting a first circuit board on top of the first semiconductor package;
mounting a second circuit board on top of the second semiconductor package;
electrically connecting the second group leads of the first semiconductor package to the first circuit board; and
electrically connecting the second group of leads of the second semiconductor package to the second circuit board.

18. The method of claim 17, wherein encapsulating both of the first and second semiconductor packages comprises forming a dam on the metal substrate that forms an enclosed region around the first and second semiconductor packages and filling the enclosed region with the potting compound.

19. The method of claim 15, further comprising configuring the power module to comprise a half-bridge circuit, wherein the first semiconductor package is a high-side switch of the half-bridge circuit, and wherein the second semiconductor package is a low-side switch of the half-bridge circuit.

20. The method of claim 19, wherein the metal frame comprises first and second third tabs that are exposed from the potting compound after encapsulating both of the first and second semiconductor packages, the second and third tabs being electrically connected to first and second DC voltage terminals of half-bridge circuit, respectively, and wherein the method further comprises connecting the first and second tabs to external busbar structures after encapsulating both of the first and second semiconductor packages.

\* \* \* \* \*

UNITED STATES PATENT AND TRADEMARK OFFICE
CERTIFICATE OF CORRECTION

| | |
|---|---|
| PATENT NO. | : 11,973,012 B2 |
| APPLICATION NO. | : 17/385596 |
| DATED | : April 30, 2024 |
| INVENTOR(S) | : Grassmann |

It is certified that error appears in the above-identified patent and that said Letters Patent is hereby corrected as shown below:

In the Specification

Figure 7:
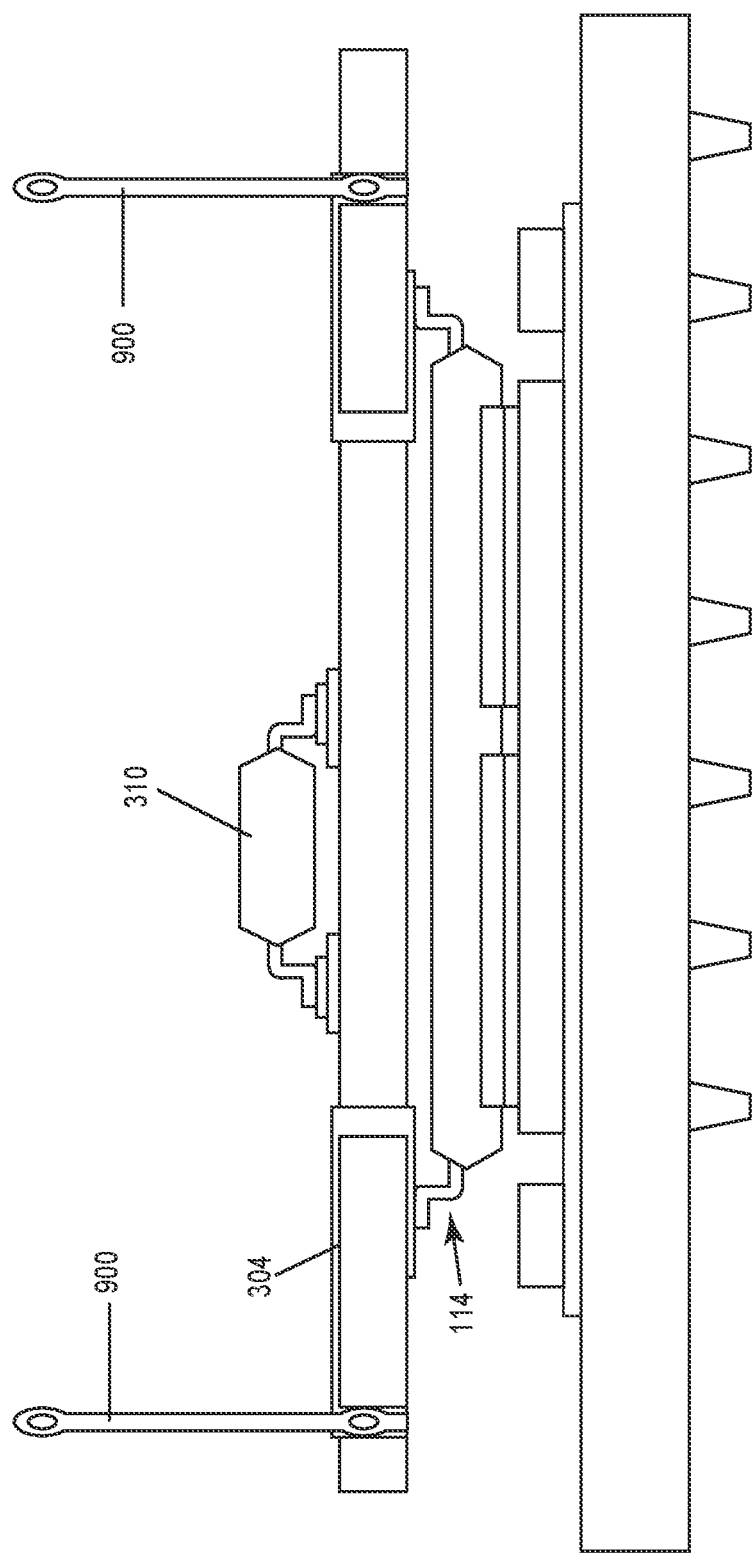
FIG. 7 schematically illustrates a side-view of an assembly of multiple semiconductor packages mounted on a metal frame with press-fit connectors affixed to circuit boards on top of the semiconductor packages, according to an embodiment.

Column 12, Line 56 please change "Referring to FIG. 9," to -- Referring to FIG. 7, --

Figure 8:
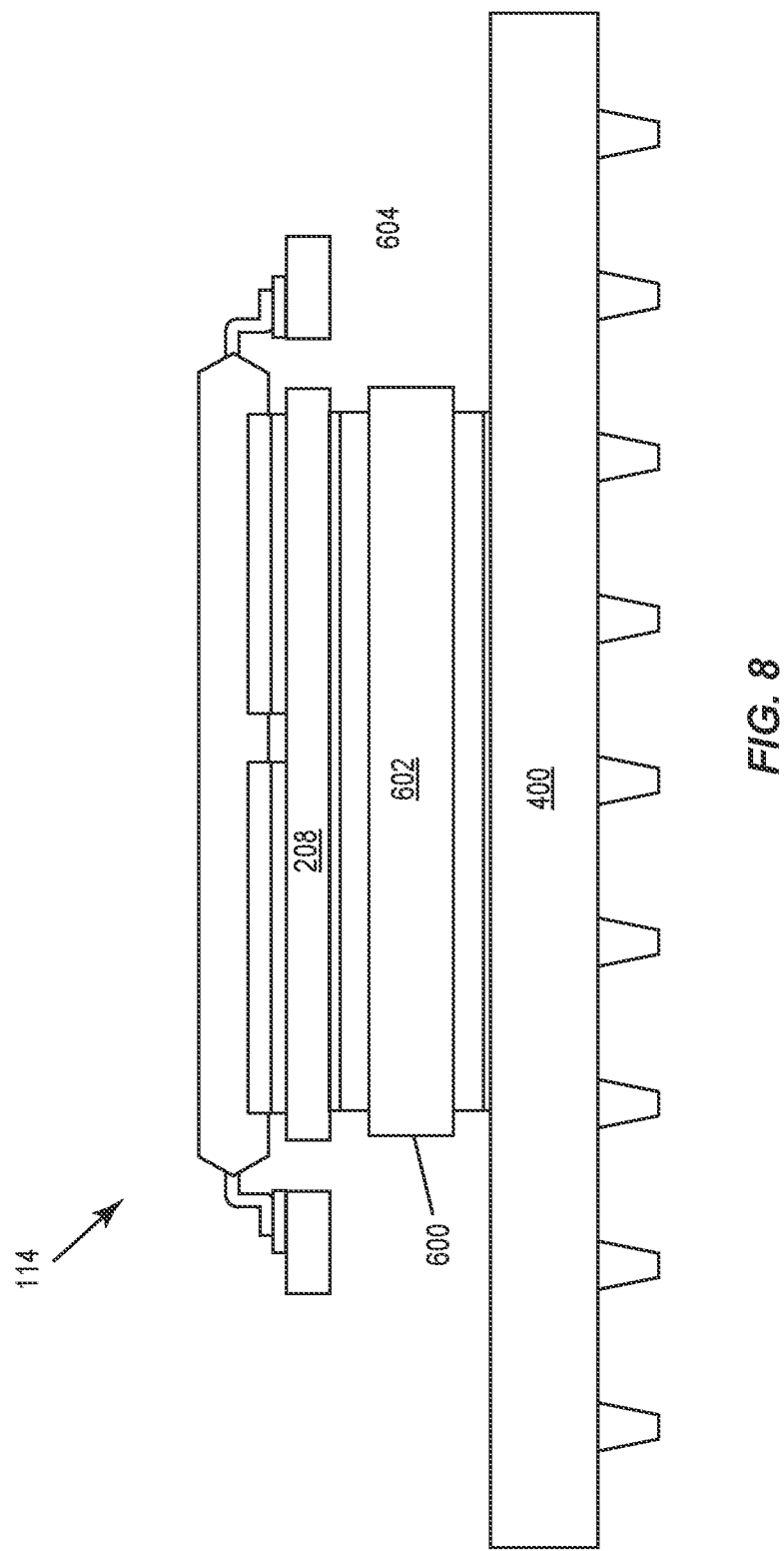
FIG. 8 schematically illustrates a side-view of an assembly of multiple semiconductor packages mounted on a metal frame with a power electronics substrate that is configured as an electrical isolation structure between the metal frame and a metal substrate, according to an embodiment.

Column 13, Line 16 please change "Referring to FIG. 9," to -- Referring to FIG. 8, --

Column 13, Line 35 please change "Referring to FIG. 10," to -- Referring to FIG. 9, --

Column 13, Line 39 please change "FIG. 10A" to -- FIG. 9A --

Column 13, Line 49 please change "FIG. 10B" to -- FIG. 9B --

In the Claims

Column 15, Lines 31-32 (Claim 8, Lines 2-3) please change "surface the" to -- surface of the --

Column 15, Line 33 (Claim 8, Line 4) please change "surface the" to -- surface of the --

Column 15, Line 64 (Claim 12, Line 16) please change "wherein power" to -- wherein the power --

Column 17, Line 10 (Claim 20, Line 2) please change "first and second third tabs" to -- second and third tabs --

Column 17, Lines 15-16 (Claim 20, Lines 14-15) please change "first and second tabs" to -- second and third tabs --

Signed and Sealed this
Second Day of July, 2024

Katherine Kelly Vidal
*Director of the United States Patent and Trademark Office*